(12) United States Patent
Wagner et al.

(10) Patent No.: US 7,885,062 B2
(45) Date of Patent: Feb. 8, 2011

(54) COMPUTER CHASSIS WITH PARTITIONS FOR IMPROVED AIRFLOW

(75) Inventors: Barry A. Wagner, San Jose, CA (US); Don Le, San Jose, CA (US); William P. Tsu, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 45 days.

(21) Appl. No.: 11/299,056

(22) Filed: Dec. 9, 2005

(65) Prior Publication Data

US 2007/0133167 A1 Jun. 14, 2007

(51) Int. Cl.
*H05K 5/00* (2006.01)

(52) U.S. Cl. .................................. 361/679.49

(58) Field of Classification Search .............. 361/676, 361/678, 690, 692, 695, 677; 62/263, 259.2; 439/487

See application file for complete search history.

(56) References Cited

U.S. PATENT DOCUMENTS

| | | | |
|---|---|---|---|
| 3,903,404 A | 9/1975 | Beall et al. | |
| 4,027,206 A | 5/1977 | Lee | |
| 4,237,521 A | 12/1980 | Denker | |
| 5,361,188 A * | 11/1994 | Kondou et al. | 361/695 |
| 5,615,085 A | 3/1997 | Wakabayashi et al. | |
| 5,694,294 A | 12/1997 | Ohashi et al. | |
| 5,793,608 A * | 8/1998 | Winick et al. | 361/695 |
| 5,796,580 A | 8/1998 | Komatsu et al. | |
| 5,860,291 A * | 1/1999 | Johnson et al. | 62/259.2 |
| 6,094,347 A | 7/2000 | Bhatia | |
| 6,115,250 A * | 9/2000 | Schmitt | 361/695 |
| 6,215,657 B1 | 4/2001 | Bhatia | |
| 6,350,033 B1 | 2/2002 | Fujimori | |
| 6,487,074 B1 | 11/2002 | Kimura et al. | |
| 6,599,090 B2 | 7/2003 | Ozaki et al. | |
| 6,657,680 B2 | 12/2003 | Takizawa | |
| 6,744,629 B2 | 6/2004 | Hidesawa | |
| 6,822,859 B2 * | 11/2004 | Coglitore et al. | 361/687 |
| 6,866,389 B2 | 3/2005 | Ito et al. | |
| 6,966,655 B2 | 11/2005 | Hara et al. | |
| 7,061,761 B2 * | 6/2006 | Tucker et al. | 361/695 |
| 7,359,205 B1 | 4/2008 | Sun et al. | |
| 2001/0036061 A1 * | 11/2001 | Donahoe et al. | 361/687 |

(Continued)

OTHER PUBLICATIONS

"Balanced Technology Extended BTX Interface Specification"; version 1.0a, Feb. 2004; copyright 2003, 2004 Intel Corporation; 32 pages.

(Continued)

*Primary Examiner*—Chandrika Prasad (57) ABSTRACT

The present invention pertains to a computer chassis with improved airflow to reduce the occurrence of trapped air pockets and increase heat transfer from components within the chassis. The computer chassis includes a plurality of chambers, wherein each of the chambers is separated by a partition. The partitions are operable to reduce the occurrence of trapped air pockets and increase heat transfer from components of the chassis by causing air to flow through each of the chambers. The computer chassis further includes at least two air vents, wherein each of the chambers is coupled to at least one of the at least two air vents through which air enters the chamber, and wherein each of the chambers is coupled to at least one of the at least two air vents through which air exits the chamber.

20 Claims, 9 Drawing Sheets

U.S. PATENT DOCUMENTS

2003/0117782 A1*   6/2003   Wrycraft et al. ............ 361/752
2003/0128525 A1*   7/2003   Berry et al. ................. 361/726
2005/0225936 A1*  10/2005   Day .......................... 361/687
2006/0120192 A1*   6/2006   Miyamoto et al. .......... 365/221
2006/0197546 A1*   9/2006   Co et al. .................... 324/760

OTHER PUBLICATIONS

"ATX Specification"; version 2.2; copyright 2003-2004 Intel Corporation; 26 pages.

* cited by examiner

COMPUTER CHASSIS WITH PARTITIONS FOR IMPROVED AIRFLOW

FIELD OF THE INVENTION

The field of the present invention relates to chassis design for electronic devices, e.g., computer systems, and more particularly to systems for improved cooling of components housed in computer chassis.

BACKGROUND OF THE INVENTION

Over the past ten years, the amount of heat generated by individual components within computer systems has increased dramatically. For example, in 1995 when Intel Corporation introduced the ATX form factor specification, central processing units (CPUs) dissipated around 10 watts of heat. Some ten years later when Intel introduced the BTX form factor specification, CPUs dissipated nearly 150 watts of heat. Along the same lines, the average high-performance graphics card now dissipates around 80 watts of heat, whereas graphics cards from 1995 dissipated about one-tenth that amount. As such, it is becoming increasingly more important to adequately cool high-power components within the computer chassis to ensure reliability and increase the performance of each component.

Figure 1:
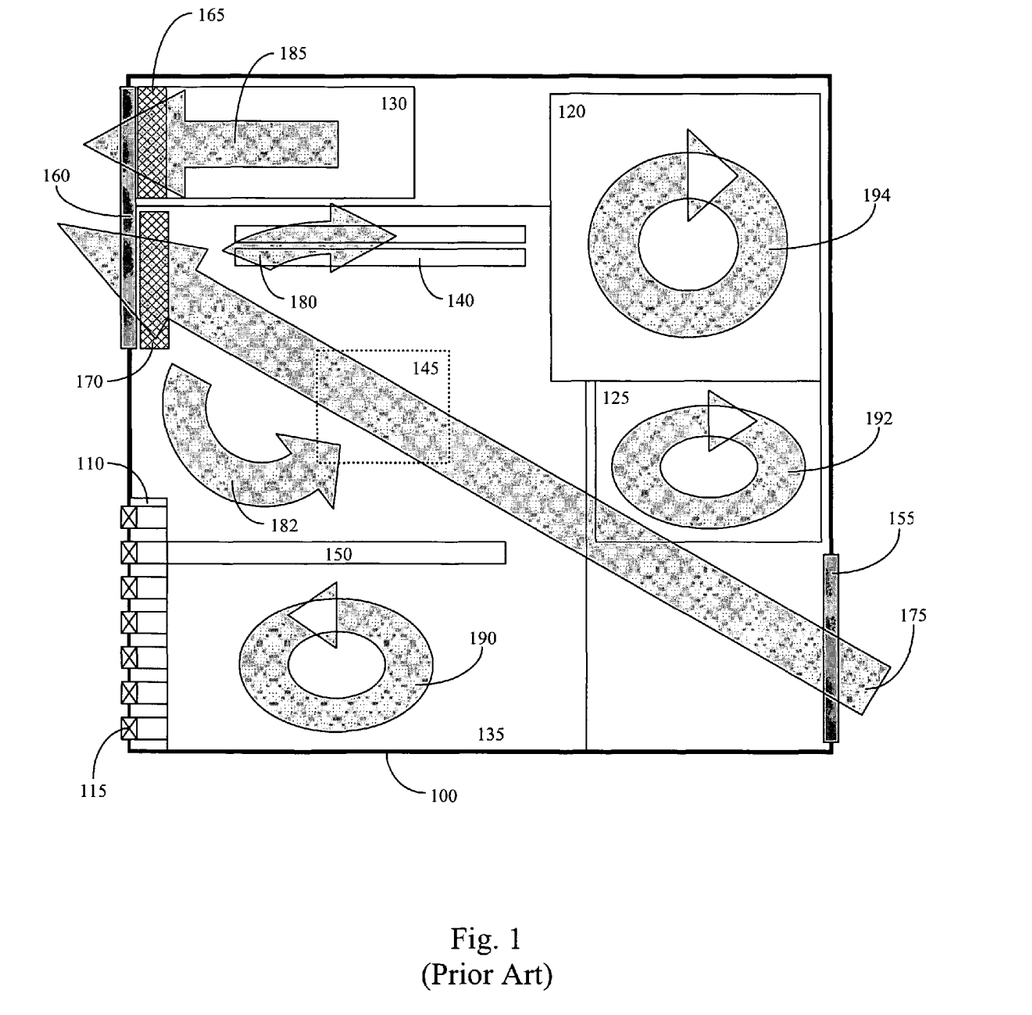
FIG. 1 shows a computer chassis in accordance with the ATX form factor specification.

FIG. 1 shows a computer "tower" chassis in accordance with the ATX form factor specification. Accordingly, chassis 100 has input/output (I/O) slot area 110 providing slots in which peripheral interface cards can be inserted. When slots are unoccupied, solid plates cover the holes as shown by blocked-off I/O slot 115. 5.25 inch optical drives are inserted in optical drive area 120, and 3.5 inch hard disk drives (HDDs) are inserted in HDD area 125. Chassis 100 also includes power supply unit (PSU) 130, which supplies power to motherboard 135. PSU fan 165 helps to cool PSU 130 by directing air through the power supply enclosure and out vent 160, shown in FIG. 1 as PSU airflow 185. System memory 140 and CPU 145 are detachably coupled to motherboard 135, which has connectors aligned with the slots comprising I/O slot area 110 for receiving peripheral interface devices. On such peripheral interface device is graphics card 150.

As shown in FIG. 1, vent 155 and vent 160 are placed on the front and rear of the chassis to permit air to flow through chassis 100. Chassis fan 170 creates main airflow 175, which enters through vent 175 and exhausts through vent 160. However, not all the air entering vent 155 is exhausted out vent 160, creating recirculation airflow 180 and 182. As such, hot air from CPU 145 is directed back over some of the larger heat-generating components: system memory 140 and graphics card 150. Not only does the recirculation of hot air within the chassis reduce the reliability and performance of most components, but it also significantly reduces the potential heat dissipation from each component by increasing the ambient air temperature within the chassis. Moreover, trapped air pockets 190, 192, and 194 around the graphics card, HDD, and optical drives further increase the temperatures around these components. As such, a chassis in accordance with the ATX specification creates a significant reliability and performance bottleneck for system builders.

Figure 2:
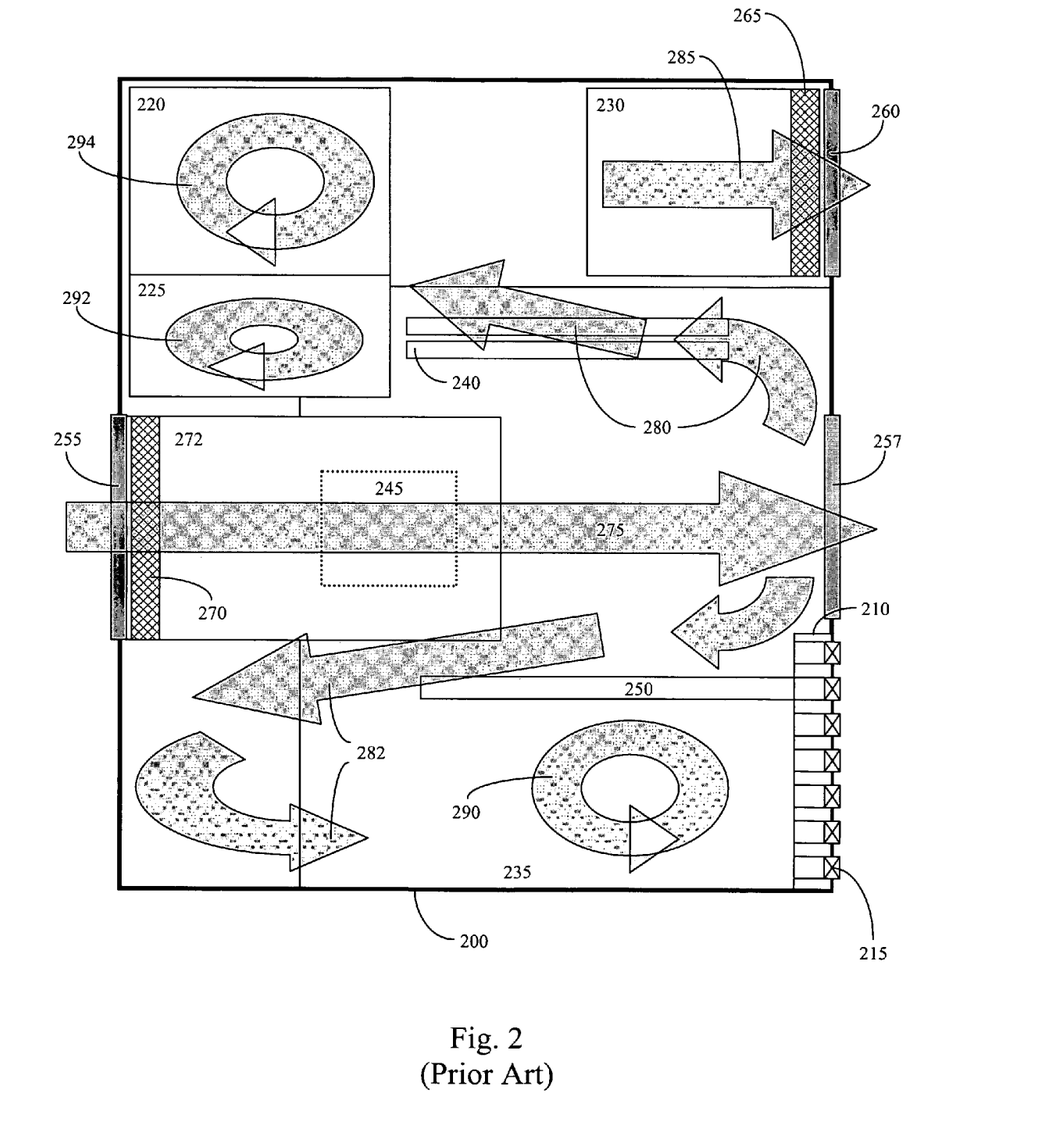
FIG. 2 shows a computer chassis in accordance with the BTX form factor specification.

FIG. 2 shows a computer "tower" chassis in accordance with the BTX form factor specification. Similar to the ATX chassis 100 of FIG. 1, chassis 200 of FIG. 2 includes I/O slot area 210 with blocked-off I/O slot 215, optical drive area 220, HDD area 225, and PSU 230 with PSU fan 265 for creating PSU airflow 285 that exhausts through vent 260. Also, system memory 240, CPU 245, and graphics card 250 are detachably coupled to motherboard 235. Main airflow 275 is created by chassis fan 270, which draws air into chassis 200 through vent 255 and exhausts the air through vent 257.

However, unlike chassis 100 conforming to the ATX specification, chassis 200 includes thermal module 272 for directing main airflow 275 over CPU 245. Nonetheless, not all the air entering the chassis through vent 255 exits through vent 257. As such, recirculation airflow 280 and 282 directs hot air back over system memory 240 and graphics card 250. Moreover, chassis 200 creates trapped air pockets 290, 292, and 294, which increases the ambient air temperature around the main heat-generating components. Thus, although the BTX specification provides more effective cooling of the CPU over the ATX specification, the reliability and performance of the main heat-generating components are still effected to much the same degree as with the ATX specification.

Figure 3:
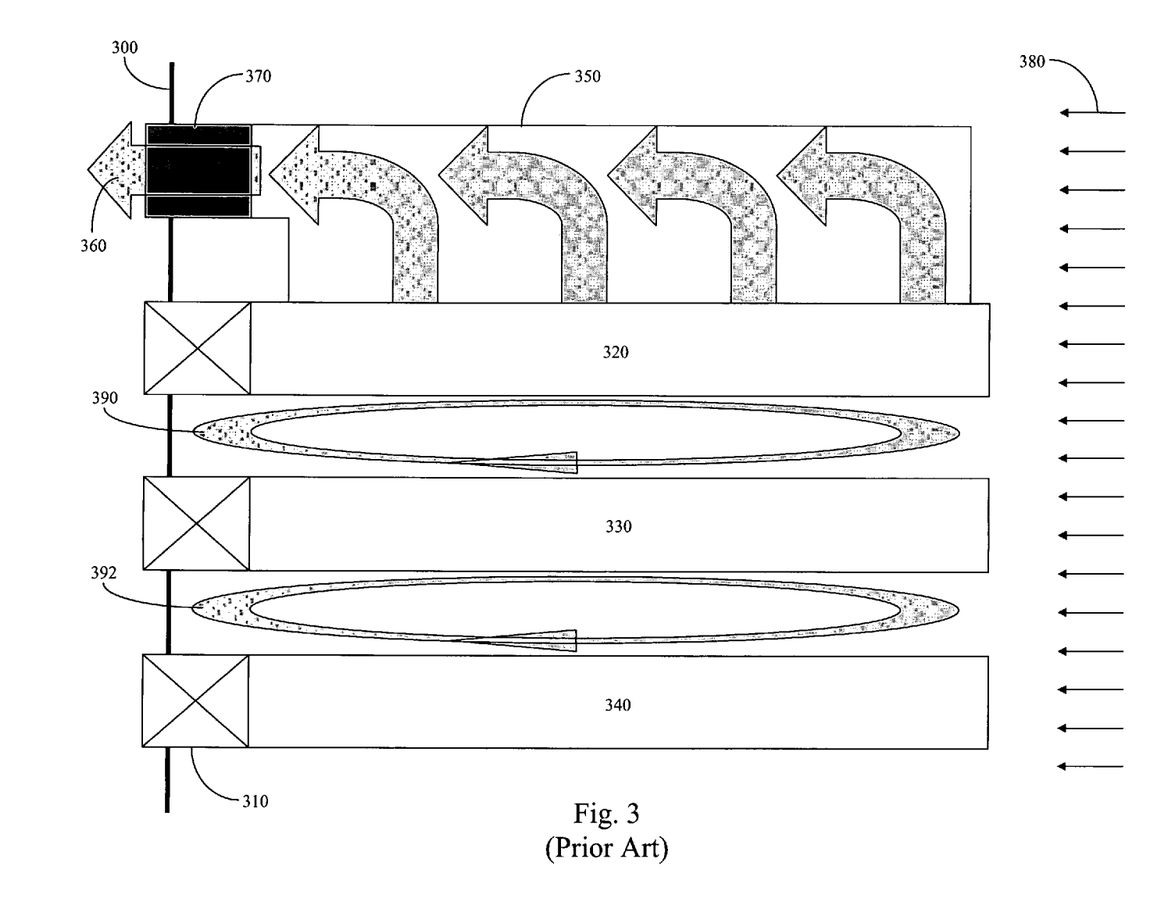
FIG. 3 shows a more detailed view of airflow within the I/O area of a computer chassis conforming to either the ATX or BTX specification.

FIG. 3 shows a more detailed view of airflow within the I/O area of a computer chassis conforming to either the ATX or BTX specification. A number of peripheral interface devices are connected to chassis 300 as shown in FIG. 3, creating a number of blocked-off I/O slots 310. More specifically, the peripheral interface devices include graphics card 320, peripheral interface device 330, and peripheral interface device 340. Graphics card fan/duct assembly 350 connected to graphics card 320 directs heated air 360 from the top side of the graphics card out vented I/O slot 370. Although this helps dissipate some heat from the graphics card, trapped air pockets 390 and 392 are formed between the peripheral interface devices which significantly hinders overall heat dissipation from graphics cards and other peripheral interface devices. Moreover, this effect is amplified given that chassis airflow 380 flowing to the I/O area is pre-heated given the high ambient air temperatures with a chassis conforming to either the ATX or BTX specification as discussed above.

SUMMARY OF THE INVENTION

In light of the problems discussed above, a need exists for a computer chassis that more effectively cools components of the computer system. And more specifically, a need exists to improve airflow through the computer chassis to reduce the occurrence of trapped air pockets and increase heat transfer from components, thereby providing increased reliability and improved performance of each component within the computer system. Moreover, given that ATX chassis will continue to be used for some time, these needs exist for chassis that are substantially compliant with both the ATX and BTX form factors. Accordingly, embodiments of the present invention provide novel solutions to these problems and others as discussed below.

Embodiments of the present invention provide a computer chassis with improved airflow to reduce the occurrence of trapped air pockets and increase heat transfer from components. In one embodiment, the chassis may be subdivided into a plurality of chambers by partitions, where each chamber has at least one vent for introducing air and at least one vent for exhausting air. This airflow may be generated, for example, by a fan placed near any of the vents. In another embodiment, the chambers are arranged such that certain high-heat dissipating components are located in separate chambers to more effectively cool each of the components. Furthermore, embodiments of the present invention reduce the occurrence of trapped air pockets and increase heat transfer from components between peripheral interface devices by providing vents on both sides of any given peripheral interface device, either by utilizing unoccupied input/output slots or by placing vents between occupied input/output slots.

More specifically, one embodiment of the present invention pertains to a computer chassis comprising: a plurality of chambers, wherein each of the chambers is separated by a partition, and wherein the partitions are operable to reduce the occurrence of trapped air pockets and increase heat transfer from components of the chassis by causing air to flow through each of the chambers; and at least two air vents, wherein each of the chambers is coupled to at least one of the at least two air vents through which air enters the chamber, and wherein each of the chambers is coupled to at least one of the at least two air vents through which air exits the chamber. Another embodiment includes the above, and further comprises a device for causing air to flow through any of the chambers wherein the device is disposed near any of the at least two air vents.

Other embodiments of the present invention include the above, and wherein the plurality of chambers comprise a tower chassis configuration, wherein the partitions are placed in a substantially horizontal orientation, wherein at least one of the at least two air vents through which air enters the chamber is placed on a top plane of the chassis, wherein at least one of the at least two air vents through which air enters the chamber is placed on a bottom plane of the chassis, and further comprise at least one feature coupled to the bottom plane for spacing the chassis off a surface on which it is placed.

Another embodiment of the present invention pertains to a computer system comprising: a motherboard; a processor; at least one slot to receive a peripheral interface device; system memory; a storage device; and a computer chassis operable to reduce the occurrence of trapped air pockets and increase heat transfer comprising: a plurality of chambers, wherein each of the chambers is separated by a partition, and wherein the partitions are operable to reduce the occurrence of trapped air pockets and increase heat transfer by causing air to flow through each of the chambers; at least two air vents, wherein each of the chambers is coupled to at least one of the at least two air vents through which air enters the chamber, and wherein each of the chambers is coupled to at least one of the at least two air vents through which air exits the chamber.

Another embodiment of the present invention pertains to a computer chassis comprising: a plurality of peripheral interface slots operable to receive at least one peripheral interface device; and a plurality of air vents comprising at least one air vent disposed on each side of the at least one peripheral interface device, wherein the plurality of air vents enable airflow over both sides of the at least one peripheral interface device such that the occurrence of trapped air pockets are reduced and heat transfer from components of the chassis is increased. Another embodiment includes the above, and wherein the plurality of air vents are located in the plurality of peripheral interface slots that are unoccupied. Other embodiments of the present invention include the above, and wherein the plurality of air vents are located between two of the plurality of peripheral interface slots.

BRIEF DESCRIPTION OF THE DRAWINGS

The present invention is illustrated by way of example, and not by way of limitation, in the figures of the accompanying drawings and in which like reference numerals refer to similar elements.

Prior art

Prior art

Prior art

DETAILED DESCRIPTION OF THE INVENTION

Reference will now be made in detail to the preferred embodiments of the present invention, examples of which are illustrated in the accompanying figures. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention provide a computer chassis with improved airflow to reduce the occurrence of trapped air pockets and increase heat transfer from components. In one embodiment, the chassis may be subdivided into a plurality of chambers by partitions, where each chamber has at least one vent for introducing air and at least one vent for exhausting air. This airflow may be generated, for example, by a fan placed near any of the vents. In another embodiment, the chambers are arranged such that certain high-heat dissipating components are located in separate chambers to more effectively cool each of the components. Furthermore, embodiments of the present invention reduce the occurrence of trapped air pockets and increase heat transfer from components between peripheral interface devices by providing vents on both sides of any given peripheral interface device, either by utilizing unoccupied input/output (I/O) slots or by placing vents between occupied I/O slots. Embodiments of the present invention and their benefits are further described below.

Figure 4:
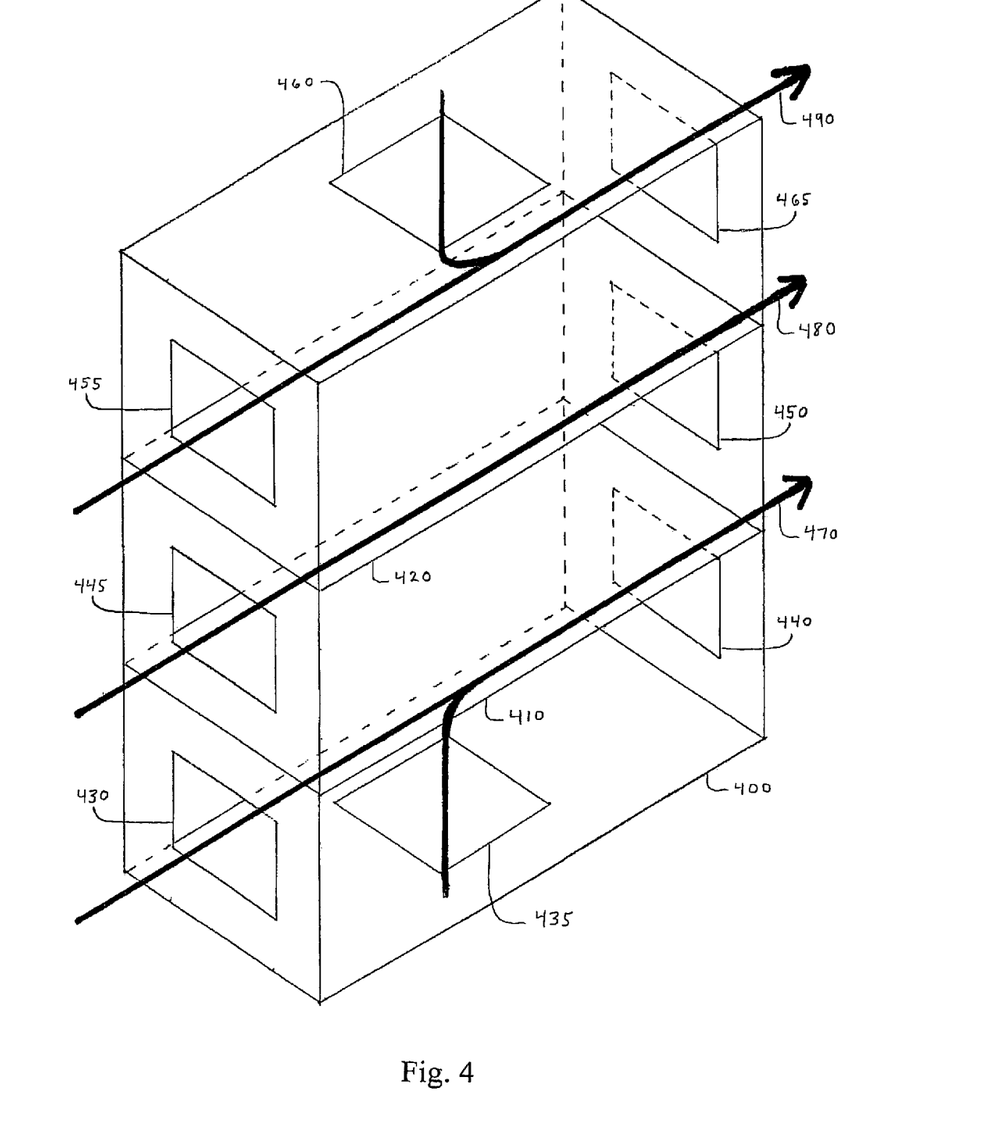
FIG. 4 shows a perspective view of a computer chassis in accordance with one embodiment of the present invention.

FIG. 4 shows a perspective view of a computer chassis in accordance with one embodiment of the present invention. In general, chassis 400 may be divided into three chambers by partition 410 and partition 420. As such, bottom chamber airflow 470 enters through vent 430 and vent 435, and exhausts through vent 440. Middle chamber airflow 480 enters through vent 445 and exhausts through vent 450. Additionally, top chamber airflow 490 enters through vent 455 and vent 460, and exhausts through vent 465.

By providing chamberized airflow through chassis 400, embodiments of the present invention provide several distinct advantages that help to improve heat transfer from any heat-generating component placed within the chassis. One advantage that embodiments of the present invention provide is the ability to minimize stagnant areas within computer chassis 400 by altering vent placement, adjusting the size and shape of the chambers, and adding additional chambers to permit airflow to areas where air would otherwise be stagnant. As such, it should be understood that although FIG. 4 only depicts a chassis with three chambers for illustration only, other embodiments of the present invention can have two or more chambers. Thus, by reducing the occurrence of stagnant areas within chassis 400, embodiments of the present invention remove trapped air pockets and increase the cooling capabilities of the chassis.

Another advantage of chamberized airflow in accordance with embodiments of the present invention is that the air velocity at any given point within the chassis can be varied by altering the size and/or shape of the chambers. As such, assuming a given mass rate of flow produced by a device located near a vent, e.g., a fan coupled to chassis 400, the velocity is increased at a given point by decreasing the cross-sectional surface area through which the air is flowing. Increased air velocity past a given heat-generating component is advantageous as more heat can be removed via convective cooling as the speed of the air is increased. Moreover, the ability to vary the velocity of the air flowing past a given component by adjusting the size and shape of the chambers is equally advantageous, as the rate at which heat is removed may begin to decline past a given air velocity due to certain fluid dynamic effects, e.g., increased turbulence, thicker boundary layer, etc. Thus, embodiments of the present invention allow the fine tuning of air flow past a given component in the chassis to increase heat transfer from the component.

As yet another advantage, embodiments of the present invention also allow more cool air to enter the chassis by increasing the vent area and the number of vents. For example, the size of vent 455 can be enlarged, so long as it does not extend into the middle chamber. As such, in other embodiments of the present invention, the temperature of top chamber airflow 490 can be decreased by allotting more vent area to either vent 455 or vent 460, or by adding more vents to the top chamber. And in other embodiments, similar changes can be made to the other vents of chassis 400 to affect the temperature of the air in other chambers.

Another advantage that embodiments of the present invention provide is the ability to reduce and/or prevent recirculation of hot air within the chassis. For example, in other embodiments of the present invention, the size or placement of vent 450 can be altered to minimize recirculation of middle chamber airflow 480. Moreover, partition 410 and partition 420 direct the airflow out vent 450, thereby reducing and/or preventing diversion of middle chamber airflow toward the top and bottom chambers.

As another advantage, embodiments of the present invention allow easy isolation of heat-producing components, thereby increasing the flow of cool air over a given component. For example, in one embodiment of the present invention, a central processing unit (CPU) may reside on the motherboard in the middle chamber. Since the CPU produces a significant amount of heat, it is advantageous to isolate it from other components, e.g. the graphics card that may reside in the bottom chamber. By isolating the CPU, ambient temperatures around other components in other chambers are reduced, thereby increasing the ability to transfer heat from these other components. Moreover, heat generated from the other components cannot migrate into the middle chamber and raise the ambient temperature of middle chamber airflow 480, thereby increasing heat transfer from the CPU.

Figure 5:
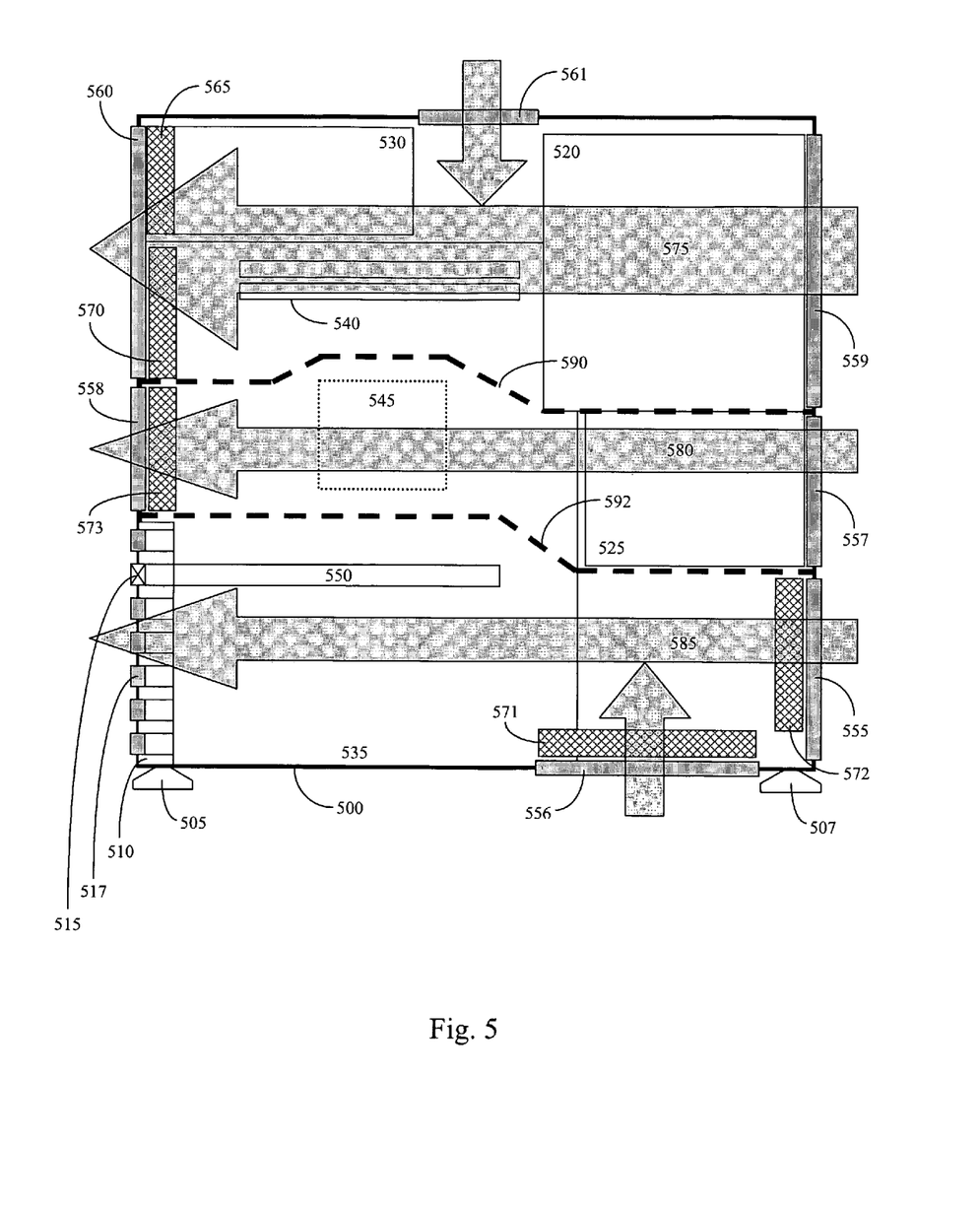
FIG. 5 shows an ATX-compliant chassis designed to reduce the occurrence of trapped air pockets and increase heat transfer from components of the chassis in accordance with one embodiment of the present invention.

FIG. 5 shows an ATX-compliant chassis designed to reduce the occurrence of trapped air pockets and increase heat transfer from components of the chassis in accordance with one embodiment of the present invention. Chassis 500 includes I/O slot area 510, PSU 530 with PSU fan 565, optical drive area 520, HDD area 525, and motherboard 535. Also, system memory 540, CPU 545 and graphics card 550 are detachably coupled to motherboard 535. Additionally, by inserting graphics card 550 into its respective I/O slot in chassis 500, blocked-off I/O slot 515 is created. However, other components depicted in FIG. 5 alter the airflow and cooling characteristics of chassis 500, thereby providing novelty over the prior art.

Figure 5A:
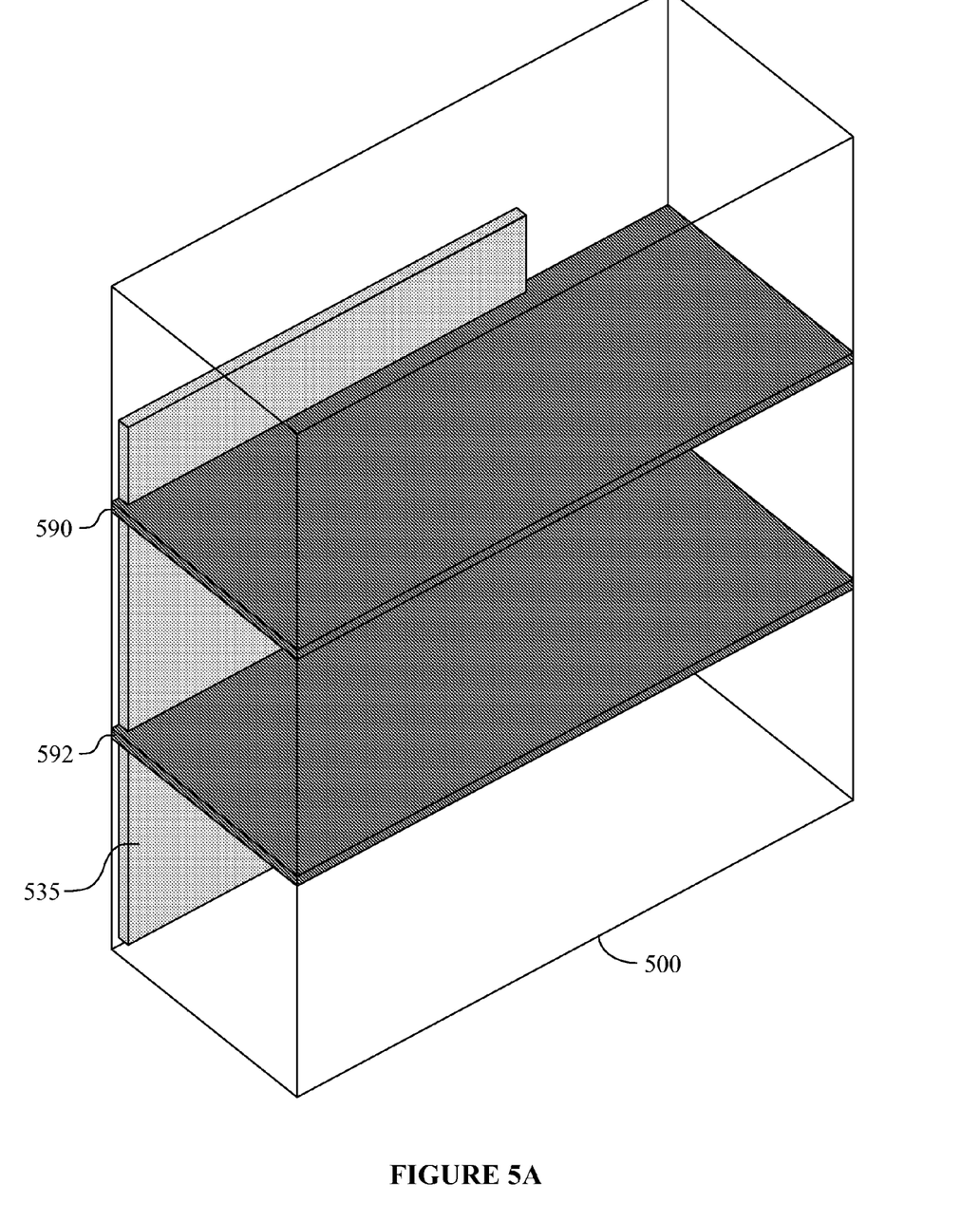
FIG. 5A shows a perspective view of a computer chassis with a motherboard disposed in at least two chambers in accordance with one embodiment of the present invention.

As shown in FIG. 5, and similarly shown in FIG. 5A, partition 590 and partition 592 create three chambers in chassis 500 similar to that discussed above with respect to chassis 400 of FIG. 4. Although only two partitions are depicted in FIGS. 5 and 5A, it should be understood that other embodiments of the present invention may utilize more or less than two partitions. Along the same lines, although partitions 590 and 592 are shown in a particular shape and size, it should also be understood that these partitions may take other forms (e.g. flat, curved, etc.) and may be placed in different orientations (e.g. at 30 degrees from the plane of the motherboard, etc.) in other embodiments of the present invention. Furthermore, in other embodiments of the invention, partition 590 and 592 may be more than one piece, such that the partitions can accommodate components within chassis 500 (e.g. one section below the motherboard, and one section above the motherboard). And in other embodiments, the partitions can be lined with a pliable material (e.g. pliable rubber, thermal interface material, etc.) to provide a seal between the partitions and components, the chassis, or other sections of partitions.

Top chamber airflow 575 is enabled by the use of partition 590 in conjunction with vent 559, vent 560, and vent 561. More specifically, chassis fan 570 and PSU fan 565 exhaust air within the top chamber out of vent 560, which in turn causes air to enter vents 559 and 561 to replenish that which has been expelled. Consequently, fresh, cool air is drawn over the optical drives, PSU 530, and system memory 540 to more effectively cool these components, increasing reliability and performance. Additionally, in other embodiments of the present invention, other vents or fans not depicted in FIG. 5 (e.g. located in the side panel of the chassis) and other partitions or ducts to help direct the airflow can be used to provide additional cool air to the components within the top chamber. As such, the use of partition 590 effectively isolates the heat sensitive components from the heat produced by other components within chassis 500. For example, PSUs tend to be extremely sensitive to heat, leading to abrupt thermal shutdown or even failure if not cooled effectively. Also, adequate cooling of system memory is important to extend its life and allow it to be run at higher speeds. Thus, embodiments of the present invention increase the reliability and performance of components within the top chamber as shown in FIG. 5 by improving airflow (e.g. by reducing the occurrence of trapped air pockets, reducing and/or preventing recirculation of hot air, increasing the speed of the airflow over the components, etc.).

Middle chamber airflow 580 is enabled by the use of partitions 590 and 592, vent 557 and vent 558. More specifically, chassis fan 573 exhausts air within the middle chamber out of vent 558, which in turn causes air to enter vent 557 to replenish that which has been expelled. Consequently, fresh, cool air is drawn over the HDDs and CPU 545 to more effectively cool these components, increasing reliability and performance. Additionally, in other embodiments of the present invention, other vents or fans not depicted in FIG. 5 (e.g. located near the CPU in the side panel of the chassis) and other partitions or ducts to help direct the airflow can be used to provide additional cool air to the components within the middle chamber. As such, the use of partitions 590 and 592 effectively isolate CPU 545 and the HDDs to reduce the amount by which heat generated by these components will heat the ambient air temperature in chassis 500 around other components, and also to reduce the amount by which heat generated by other components will heat the airflow over CPU 545 and the HDDs. Thus, embodiments of the present invention increase the reliability and performance of components within the middle chamber as shown in FIG. 5 by improving airflow (e.g. by reducing the occurrence of trapped air pockets, reducing and/or preventing recirculation of hot air, increasing the speed of the airflow over the components, etc.).

Bottom chamber airflow 585 is enabled by the use of partition 592, vent 555, vent 556, and vented I/O slots 517. More specifically, chassis fan 571 and chassis fan 572 draw air into the bottom chamber through vents 556 and 555. In one embodiment of the present invention, foot 505 and foot 507 (and any other foot not depicted in FIG. 5 for simplicity) effectively space chassis 500 off any surface on which it is set such that air is allowed to more effectively flow into vent 556, thereby reducing the temperature and acoustical noise of the incoming air. The air drawn in by chassis fans 571 and 572 push air out vented I/O slots 517 in the I/O area of chassis 500. Consequently, fresh, cool air is provided to every peripheral interface device (e.g. graphics card 550) and any other component located within the bottom chamber (e.g. components on motherboard 535), increasing reliability and performance. Additionally, in other embodiments of the present invention, other vents or fans not depicted in FIG. 5 (e.g. located near graphics card 550 in the side panel of the chassis) and other partitions or ducts to help direct the airflow can be used to provide additional cool air to the components within the bottom chamber. As such, the use of partition 592 effectively isolates any peripheral interface devices and other components within the bottom chamber to reduce the amount by which heat generated by these components will heat the ambient air temperature in chassis 500 around other components, and also to reduce the amount by which heat generated from other components will heat the airflow over the components in the bottom chamber. Thus, embodiments of the present invention increase the reliability and performance of components within the bottom chamber as shown in FIG. 5 by improving airflow (e.g. by reducing the occurrence of trapped air pockets, reducing and/or preventing recirculation of hot air, increasing the speed of the airflow over the components, etc.).

Figure 6:
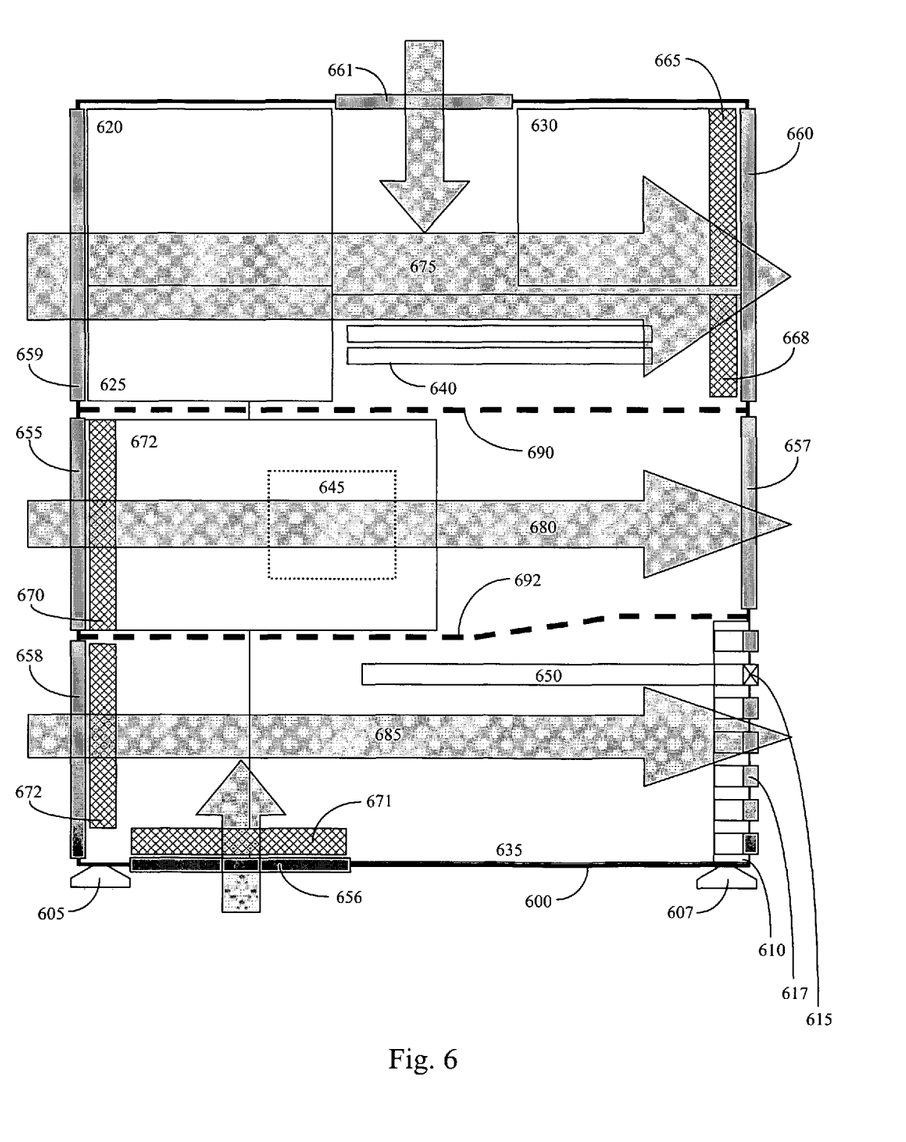
FIG. 6 shows a BTX-compliant chassis designed to reduce the occurrence of trapped air pockets and increase heat transfer from components of the chassis in accordance with one embodiment of the present invention.

FIG. 6 shows a BTX-compliant chassis designed to reduce the occurrence of trapped air pockets and increase heat transfer from components of the chassis in accordance with one embodiment of the present invention. Chassis 600 includes I/O slot area 610, PSU 630 with PSU fan 665, optical drive area 620, HDD area 625, and motherboard 635. Also, system memory 640, CPU 645 and graphics card 650 are detachably coupled to motherboard 635. Additionally, by inserting graphics card 650 into its respective I/O slot in chassis 600, blocked-off I/O slot 615 is created. However, other components depicted in FIG. 6 alter the airflow and cooling characteristics of chassis 600 in accordance with embodiments of the present invention.

As shown in FIG. 6, partition 690 and partition 692 create three chambers in chassis 600 similar to that discussed above with respect to chassis 400 of FIG. 4 and chassis 500 of FIG. 5. Although only two partitions are depicted in FIG. 6, it should be understood that other embodiments of the present invention may utilize more than two partitions. Along the same lines, although partitions 690 and 692 are shown in a particular shape and size, it should also be understood that these partitions may take other forms (e.g. flat, curved, etc.) and may be placed in different orientations (e.g. at 30 degrees from the plane of the motherboard, etc.) in other embodiments of the present invention. Furthermore, in other embodiments of the invention, partition 690 and 692 may be more than one piece, such that the partitions can accommodate components within chassis 600 (e.g. one section below the motherboard, and one section above the motherboard). And in other embodiments, the partitions can be lined with a pliable material (e.g. pliable rubber, thermal interface material, etc.) to provide a good seal between the partitions and components, the chassis, or other sections of partitions.

Top chamber airflow 675 is enabled by the use of partition 690 in conjunction with vent 659, vent 660, and vent 661. More specifically, chassis fan 668 and PSU fan 665 exhaust air within the top chamber out of vent 660, which in turn causes air to enter vents 659 and 661 to replenish that which has been expelled. Consequently, fresh, cool air is drawn over the optical drives, HDDs, PSU 630, and system memory 640 to more effectively cool these components, increasing reliability and performance. Additionally, in other embodiments of the present invention, other vents or fans not depicted in FIG. 6 (e.g. located in the side panel of the chassis) and other partitions or ducts to help direct the airflow can be used to provide additional cool air to the components within the top chamber. As such, the use of partition 690 effectively isolates the heat sensitive components from the heat produced by other components within chassis 600. For example, as discussed above with respect to FIG. 5, adequate cooling of PSUs is important to prevent abrupt thermal shutdown or failure. Also, as discussed above, adequate cooling of system memory is important to extend its life and allow it to be run at higher speeds. Thus, embodiments of the present invention increase the reliability and performance of components within the top chamber as shown in FIG. 6 by improving airflow (e.g. by reducing the occurrence of trapped air pockets, reducing and/or preventing recirculation of hot air, increasing the speed of the airflow over the components, etc.).

Middle chamber airflow 680 is enabled by the use of partitions 690 and 692, vent 655 and vent 557. More specifically, chassis fan 670 draws air into the middle chamber through vent 655, which in turn causes air within the middle chamber to exhaust through vent 657. Consequently, fresh, cool air is drawn through thermal module 672 and over CPU 645 to more effectively cool the CPU, increasing reliability and performance. Additionally, in other embodiments of the present invention, other vents or fans not depicted in FIG. 6 (e.g. located near the CPU in the side panel of the chassis) and other partitions or ducts to help direct the airflow can be used to provide additional cool air to the CPU or other components within the middle chamber. As such, the use of partitions 690 and 692 effectively isolate CPU 645 to reduce the amount by which heat generated by the CPU will heat the ambient air temperature in chassis 600 around other components, and also to reduce the amount by which heat generated from other components will heat the airflow over CPU 645. Moreover, it should be understood that in other embodiments of the present invention, partitions 690 and 692 may be coupled to thermal module 672 to more effectively direct all air entering the middle chamber through thermal module 672. Thus, embodiments of the present invention increase the reliability and performance of components within the middle chamber as shown in FIG. 6 by improving airflow (e.g. by reducing the occurrence of trapped air pockets, reducing and/or preventing recirculation of hot air, increasing the speed of the airflow over the components, etc.).

Bottom chamber airflow 685 is enabled by the use of partition 692, vent 656, vent 658, and vented I/O slots 617. More specifically, chassis fan 671 and chassis fan 672 draw air into the bottom chamber through vents 656 and 658. In one embodiment of the present invention, foot 605 and foot 607 (and any other foot not depicted in FIG. 6 for simplicity) effectively space chassis 600 off any surface on which it is set such that air is allowed to more effectively flow into vent 656, thereby reducing the temperature and acoustical noise of the incoming air. The air drawn in by chassis fans 671 and 672 push air out vented I/O slots 617 in the I/O area of chassis 600. Consequently, fresh, cool air is provided to every peripheral interface device (e.g. graphics card 650) and any other component located within the bottom chamber (e.g. components on motherboard 635), increasing reliability and performance. Additionally, in other embodiments of the present invention, other vents or fans not depicted in FIG. 6 (e.g. located near graphics card 650 in the side panel of the chassis) and other partitions or ducts to help direct the airflow can be used to provide additional cool air to the components within the bottom chamber. As such, the use of partition 692 effectively isolates any peripheral interface devices and other components within the bottom chamber to reduce the amount by which heat generated by these components will heat the ambient air temperature in chassis 600 around other components, and also to reduce the amount by which heat generated from other components will heat the airflow over the components in the bottom chamber. Thus, embodiments of the present invention increase the reliability and performance of components within the bottom chamber as shown in FIG. 6 by improving airflow (e.g. by reducing the occurrence of trapped air pockets, reducing and/or preventing recirculation of hot air, increasing the speed of the airflow over the components, etc.).

Figure 7A:
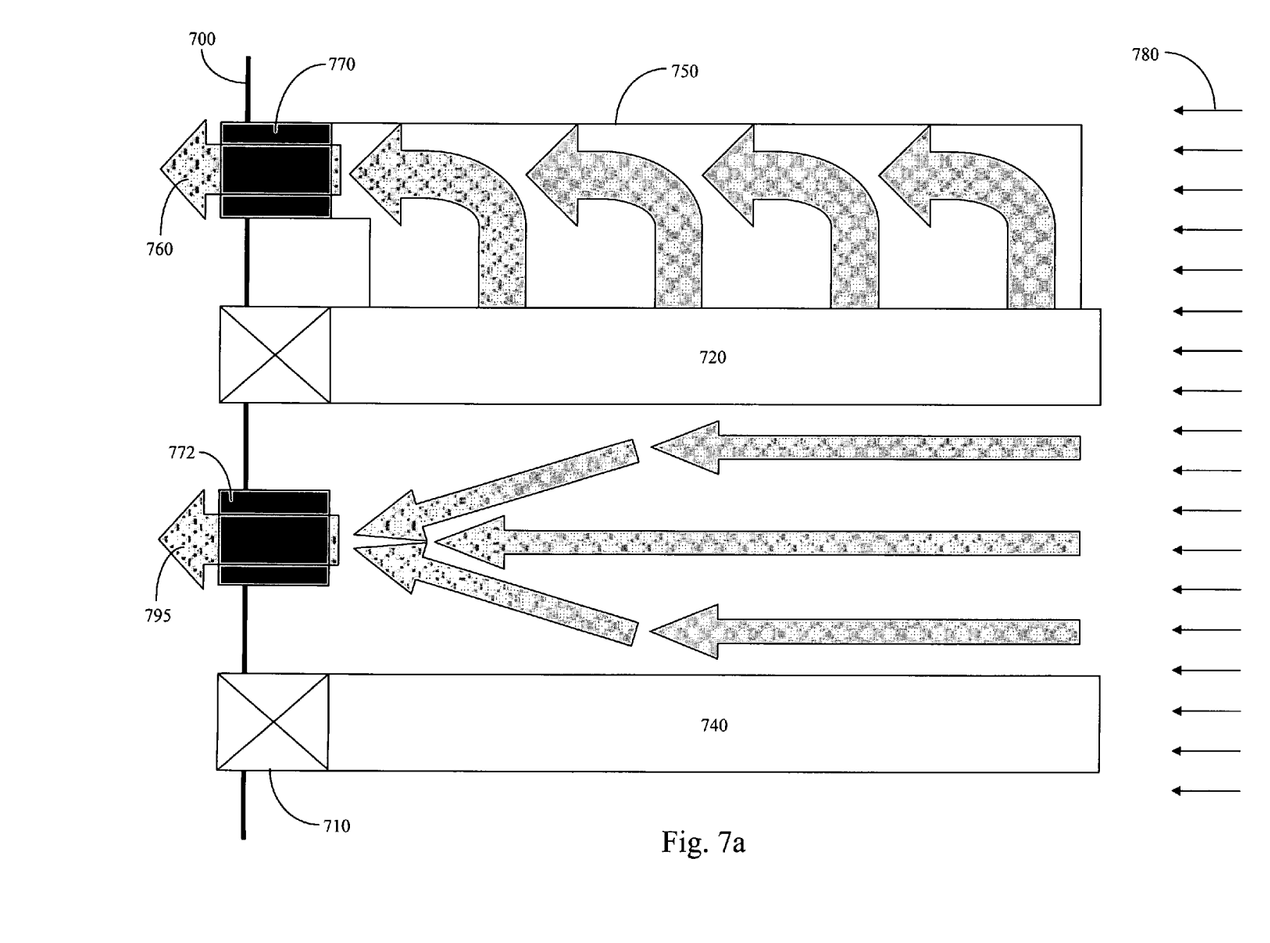
FIG. 7a shows a computer chassis designed to reduce the occurrence of trapped air pockets around peripheral interface devices and increase heat transfer from components of the chassis in accordance with one embodiment of the present invention.

FIG. 7a shows a computer chassis designed to reduce the occurrence of trapped air pockets around peripheral interface devices and increase heat transfer from components of the chassis in accordance with one embodiment of the present invention. Chassis 700 is depicted in FIG. 7a as having two detachably coupled peripheral interface devices, graphics card 720 and peripheral interface device 740, which create blocked-off I/O slots 710. Graphics card fan/duct assembly 750 connected to graphics card 720 directs heated air 760 from the top side of the graphics card out vented I/O slot 770. Additionally, vented I/O slot 772 allows chassis airflow 780, which flows between the peripheral interface devices, to exhaust from chassis 700, as shown by peripheral interface device exhaust 795. As such, embodiments of the present invention improve airflow around the peripheral interface devices (e.g. by reducing the occurrence of trapped air pockets, reducing and/or preventing recirculation of hot air, increasing the speed of the airflow over the components, etc.), thereby increasing the reliability and performance of the peripheral interface devices. Additionally, it should be understood that although only one vented I/O slot is shown in FIG. 7a, embodiments of the present invention can provide a vented I/O slot above and below each peripheral interface device to improve the airflow and provide the benefits discussed above.

Figure 7B:
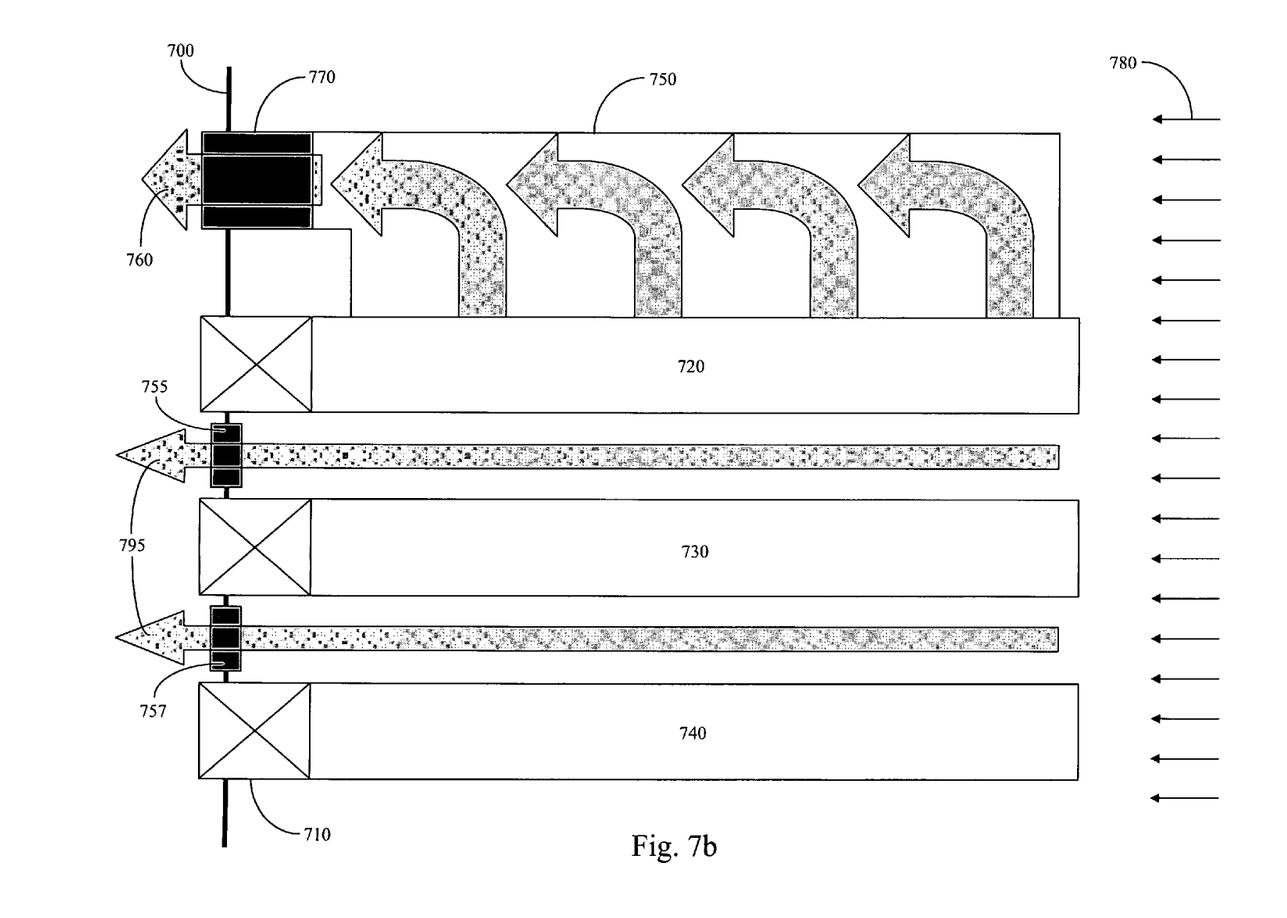
FIG. 7b shows a computer chassis designed to reduce the occurrence of trapped air pockets around peripheral interface devices and increase heat transfer from components of the chassis in accordance with one embodiment of the present invention.

FIG. 7b shows a computer chassis designed to reduce the occurrence of trapped air pockets around peripheral interface devices and increase heat transfer from components of the chassis in accordance with one embodiment of the present invention. Similar to FIG. 7a, FIG. 7b shows chassis 700 with peripheral interface device 740 and graphics card 720 coupled thereto. The peripheral interface devices create blocked-off I/O slots 710. Also, graphics card fan/duct assembly 750 connected to graphics card 720 directs heated air 760 from the top side of the graphics card out vented I/O slot 770. However, unlike the embodiment depicted in FIG. 7a, FIG. 7b shows an additional peripheral interface device, namely peripheral interface device 730, coupled to chassis 700. Additionally, vents 755 and 757 located between the I/O slots allow chassis airflow 780, which flows between the peripheral interface devices, to exhaust from chassis 700, as shown by peripheral interface device exhaust 795. As such, embodiments of the present invention improve airflow around the peripheral interface devices (e.g. by reducing the occurrence of trapped air pockets, reducing and/or preventing recirculation of hot air, increasing the speed of the airflow over the components, etc.), thereby increasing the reliability and performance of the peripheral interface devices. Additionally, it should be understood that although only two vents located between the I/O slots are shown in FIG. 7b, embodiments of the present invention can provide vents above and below each peripheral interface device to improve the airflow and provide the benefits discussed above. Moreover, in other embodiments of the present invention, chassis 700 may utilize a combination of vented I/O slots and vents located between I/O slots to provide airflow on both sides of each coupled peripheral interface device, thereby providing the benefits discussed above with respect to other embodiments of the present invention.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. Accordingly, the specification and drawings are to be regarded in an illustrative rather than a restrictive sense.

What is claimed is:

1. A computer chassis comprising:
   a plurality of partitions extending from a first side of said computer chassis to a second side of said computer chassis, wherein said plurality of partitions further extend to a third side of said computer chassis;
   a plurality of chambers separated by said plurality of partitions, wherein a first chamber of said plurality of chambers is operable to interface with a first portion of a motherboard, and wherein a second chamber of said plurality of chambers is operable to interface with a second portion of said motherboard; and a plurality of air vents for enabling air to flow through said plurality of chambers.

2. The computer chassis of claim 1, wherein said plurality of air vents are disposed in at least two different sides of said chassis.

3. The computer chassis of claim 1, wherein said plurality of air vents further comprise:
 a first group of air vents for enabling air to enter each of said plurality of chambers; and
 a second group of air vents for enabling air to exit each of said plurality of chambers.

4. The computer chassis of claim 1 further comprising:
 at least one device for causing said air to flow through said plurality of chambers, and wherein said at least one device is disposed near at least one of said plurality of air vents.

5. The computer chassis of claim 4, wherein said at least one device is at least one fan.

6. The computer chassis of claim 1, wherein said plurality of chambers are arranged in a tower chassis configuration, wherein each of said partitions is placed in a substantially horizontal orientation, wherein at least one of said plurality of air vents is disposed on a top surface of said chassis, and wherein at least one of said plurality of air vents is disposed on a bottom surface of said chassis.

7. A computer system comprising:
 a motherboard;
 a computer chassis comprising:
 a plurality of partitions extending from a first side of said computer chassis to a second side of said computer chassis, wherein said plurality of partitions further extend to a third side of said computer chassis;
 a plurality of chambers separated by said plurality of partitions, wherein a first chamber of said plurality of chambers is operable to interface with a first portion of said motherboard, and wherein a second chamber of said plurality of chambers is operable to interface with a second portion of said motherboard; and
 a plurality of air vents for enabling air to flow through said plurality of chambers;
 a processor coupled to said motherboard;
 a memory coupled to said motherboard; and
 a peripheral interface device coupled to said motherboard.

8. The computer system of claim 7, wherein said peripheral interface device is disposed in a first chamber of said plurality of chambers, and wherein said processor and said memory are disposed in at least one chamber separate from said first chamber.

9. The computer system of claim 7, wherein said processor is disposed in a first chamber of said plurality of chambers, and wherein said peripheral interface device and said memory are disposed in at least one chamber separate from said first chamber.

10. The computer system of claim 7, wherein said plurality of air vents are disposed in at least two different sides of said chassis.

11. The computer system of claim 7, wherein said plurality of air vents further comprise:
 a first group of air vents for enabling air to enter each of said plurality of chambers; and
 a second group of air vents for enabling air to exit each of said plurality of chambers.

12. The computer system of claim 7 further comprising:
 at least one device for causing said air to flow through said plurality of chambers, and wherein said at least one device is disposed near at least one of said plurality of air vents.

13. The computer system of claim 12, wherein said at least one device is at least one fan.

14. The computer system of claim 7, wherein said plurality of chambers are arranged in a tower chassis configuration, wherein each of said partitions is placed in a substantially horizontal orientation, wherein at least one of said plurality of air vents is disposed on a top surface of said chassis, and wherein at least one of said plurality of air vents is disposed on a bottom surface of said chassis.

15. A computer chassis comprising:
 a plurality of peripheral interface slots, wherein said plurality of peripheral interface slots comprises a first peripheral interface slot operable to accept and physically couple to a peripheral interface device, wherein said first peripheral interface slot is further operable to enable physical coupling of said peripheral interface device to a motherboard, and wherein said plurality of peripheral interface slots further comprises a second peripheral interface slot and a third peripheral interface slot;
 a first air vent for enabling air to flow over a first side of said peripheral interface device, wherein said first air vent is disposed between said first and second peripheral interface slots; and
 a second air vent for enabling air to flow over a second side of said peripheral interface device, and wherein said second air vent is disposed between said first and third peripheral interface slots.

16. The computer chassis of claim 15, wherein said first air vent is disposed in an unoccupied peripheral interface slot adjacent to said peripheral interface slot.

17. The computer chassis of claim 15, wherein said first air vent is disposed between said peripheral interface slot and a second peripheral interface slot, wherein said second peripheral interface slot is adjacent to said peripheral interface slot.

18. The computer chassis of claim 15 further comprising:
 at least one device for causing said air to flow over said peripheral interface device, and wherein said at least one device is disposed near an air vent selected from a group consisting of said first air vent and said second air vent.

19. The computer chassis of claim 18, wherein said at least one device is at least one fan.

20. The computer chassis of claim 15, wherein said peripheral interface device comprises a graphics card.

* * * * *